(12) United States Patent
Misumi et al.

(10) Patent No.: US 7,763,966 B2
(45) Date of Patent: Jul. 27, 2010

(54) RESIN MOLDED SEMICONDUCTOR DEVICE AND DIFFERENTIAL AMPLIFIER CIRCUIT

(75) Inventors: Kazuyuki Misumi, Tokyo (JP); Kazushi Hatauchi, Tokyo (JP); Yasuki Takata, Tokyo (JP); Naoya Yasuda, Tokyo (JP); Hideyuki Arakawa, Tokyo (JP); Katsuyuki Fukudome, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 31 days.

(21) Appl. No.: 12/073,384

(22) Filed: Mar. 5, 2008

(65) Prior Publication Data
US 2008/0217750 A1 Sep. 11, 2008

(30) Foreign Application Priority Data
Mar. 6, 2007 (JP) ............................. 2007-055247

(51) Int. Cl.
*H01L 23/495* (2006.01)
*H01L 23/12* (2006.01)
*H01L 23/48* (2006.01)
*H01L 23/52* (2006.01)

(52) U.S. Cl. ................ 257/692; 257/676; 257/690; 257/784

(58) Field of Classification Search .......... 257/666, 257/784, 676, 690, 692
See application file for complete search history.

(56) References Cited

U.S. PATENT DOCUMENTS

| | | | | |
|---|---|---|---|---|
| 5,343,074 A | * | 8/1994 | Higgins et al. | 257/668 |
| 5,508,232 A | * | 4/1996 | Ueda et al. | 29/827 |
| 5,891,377 A | * | 4/1999 | Libres et al. | 264/272.14 |
| 5,903,050 A | * | 5/1999 | Thurairajaratnam et al. | 257/695 |
| 6,118,173 A | * | 9/2000 | Emoto | 257/666 |
| 6,133,623 A | * | 10/2000 | Otsuki et al. | 257/666 |
| 6,160,307 A | * | 12/2000 | Kweon | 257/676 |
| 6,198,163 B1 | * | 3/2001 | Crowley et al. | 257/706 |
| 6,538,336 B1 | * | 3/2003 | Secker et al. | 257/786 |
| 6,903,448 B1 | * | 6/2005 | Sutardja et al. | 257/666 |
| 6,992,377 B2 | * | 1/2006 | Zhou et al. | 257/692 |
| 7,479,680 B2 | * | 1/2009 | Dunnihoo et al. | 257/355 |
| 2002/0163066 A1 | * | 11/2002 | Ke et al. | 257/678 |
| 2006/0174704 A1 | * | 8/2006 | Tsubaki | 73/514.16 |
| 2010/0032818 A1 | * | 2/2010 | Pilling et al. | 257/676 |

FOREIGN PATENT DOCUMENTS

JP    1-202853    8/1989
JP    7-14976     1/1995

* cited by examiner

*Primary Examiner*—Sue Purvis
*Assistant Examiner*—Teresa M. Arroyo
(74) *Attorney, Agent, or Firm*—McDermott Will & Emery LLP (57) ABSTRACT

A plurality of inner leads 14 are provided around a die pad 13. A grounded GND lead 16 is provided in a region between the die pad 13 and the plurality of inner leads 14. A semiconductor chip 17 and the plurality of inner leads 14 are connected to each other by a plurality of wires 21. The semiconductor chip 17 and the GND lead 16 are connected to each other by GND wires 22. The GND wires 22 are disposed between a plurality of wires 21. The distance between ends of each adjacent pair of the inner leads 14 is 0.2 mm or less.

2 Claims, 10 Drawing Sheets

RESIN MOLDED SEMICONDUCTOR DEVICE AND DIFFERENTIAL AMPLIFIER CIRCUIT

BACKGROUND OF THE INVENTION

1. Field of the Invention

The present invention relates to a resin-molded semiconductor device in which a plurality of pads on a semiconductor chip and a plurality of inner leads are connected to each other by wires.

2. Background Art

Semiconductor devices having a grounded GND lead between a die pad and a plurality of inner leads are being used. GND wires connecting this GND lead and a semiconductor chip are disposed between a plurality of wires respectively connecting the semiconductor chip and the plurality of inner leads to each other. Therefore, the distance between each adjacent pair of the inner leads around the GND wires is increased to about 0.4 to 0.5 mm.

SUMMARY OF THE INVENTION

If lead frames of such a construction are stored by one being superposed on another, there is a possibility of the surfaces of an adjacent pair of the inner leads having a wider distance between their ends being deeply scratched by being rubbed. There is a problem that when a wire is stitch-bonded to the scratched inner lead, stitch separation can occur. This problem can be avoided by putting interlayer paper between the lead frames, but a cost-increase problem and a problem that the number of lead frames housed in a case is reduced then arise.

Conventionally, an L-shaped inner lead is used in some cases. This L-shaped inner lead has a portion provided in a region between a die pad and a plurality of inner leads extending along the direction of arrangement of the plurality of inner leads. There is problem that when a wire stitch-bonded to this portion is cut by being pulled, the L-shaped inner lead is lifted up.

Also, a large parasitic capacitance is attached in the vicinity of each pad on a semiconductor chip. If a large parasitic capacitance is attached at an intermediate position in a transmission line, the characteristic impedance is reduced at the intermediate position. If a characteristic impedance mismatch is increased thereby, a loss due to signal reflection is increased and the signal transmission characteristics deteriorate.

Japanese Patent Laid-Open No. 1-202853 and Japanese Patent Laid-Open No. 7-14976 disclose a technique to reduce a characteristic impedance mismatch due to such a cause by adjusting the distance between inner leads. However, there is a problem that increasing the distance between inner leads for the purpose of preventing reduction in characteristic impedance leads to an increase in size of the semiconductor device.

In view of the above-described problems, a first object of the present invention is to provide a semiconductor device capable of preventing the surfaces of inner leads from being scratched by being rubbed.

A second object of the present invention is to provide a semiconductor device capable of preventing an inner lead from being lifted up when a stitch-bonded wired is cut.

A third object of the present invention is to provide a semiconductor device capable of limiting increase in size and reducing a characteristic impedance mismatch to prevent deterioration in signal transfer characteristics.

According to one embodiment of the present invention, a semiconductor device comprises: a die pad; a plurality of inner leads provided around the die pad; a GND lead provided in a region between the die pad and the plurality of inner leads and grounded; a semiconductor chip mounted on the die pad; a plurality of wires respectively connecting a plurality of pads on the semiconductor chip and the plurality of inner leads to each other; and GND wires disposed between the plurality of wires to make connections between the pads on the semiconductor chip and the GND lead, wherein the distance between ends of each adjacent pair of the inner leads is 0.2 mm or less.

According to this embodiment, it is possible to prevent the surfaces of the inner leads from being scratched by being rubbed.

DETAILED DESCRIPTION OF THE PREFERRED EMBODIMENTS

First Embodiment

Figure 1:
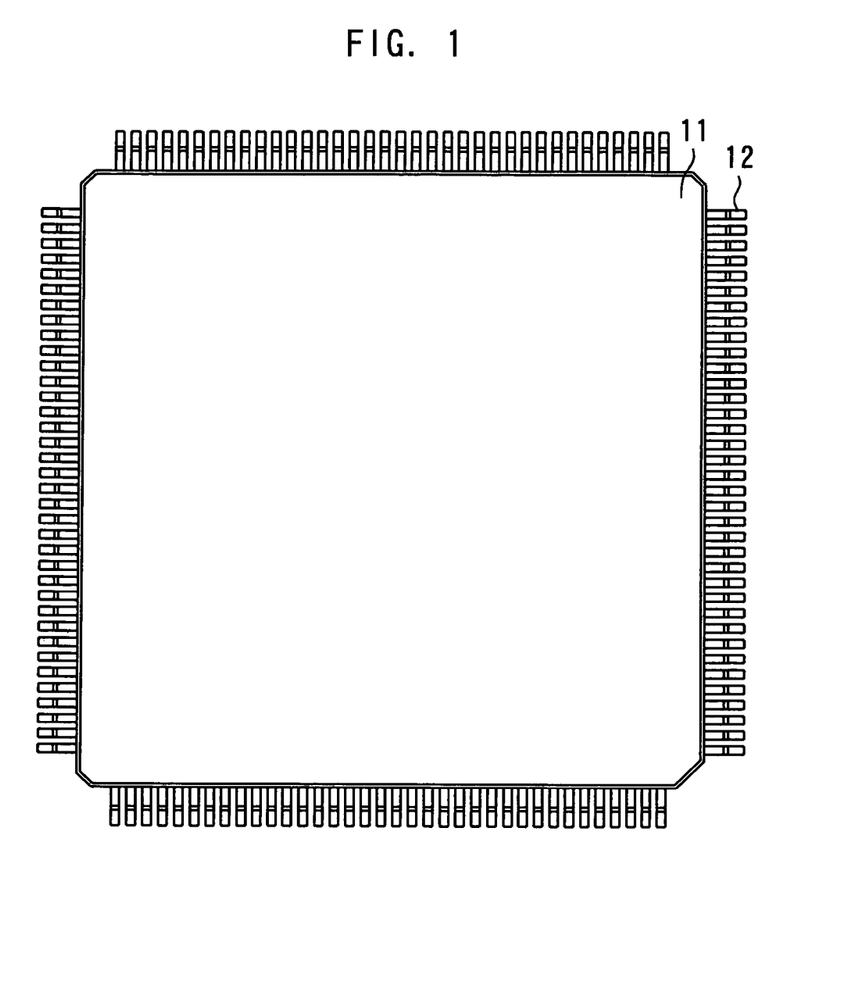
FIG. 1 is a plan view showing a semiconductor device according to a first embodiment of the present invention.
Figure 2:
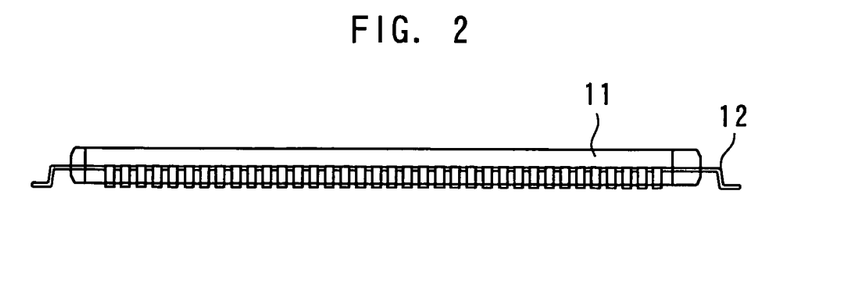
FIG. 2 is a side view of the semiconductor device.

FIG. 1 is a plan view showing a semiconductor device according to a first embodiment of the present invention, and FIG. 2 is a side view of the semiconductor device. A plurality of outer leads 12 extend from a package body 11 in which a semiconductor chip (described below) is encapsulated with a molding resin.

Figure 3:
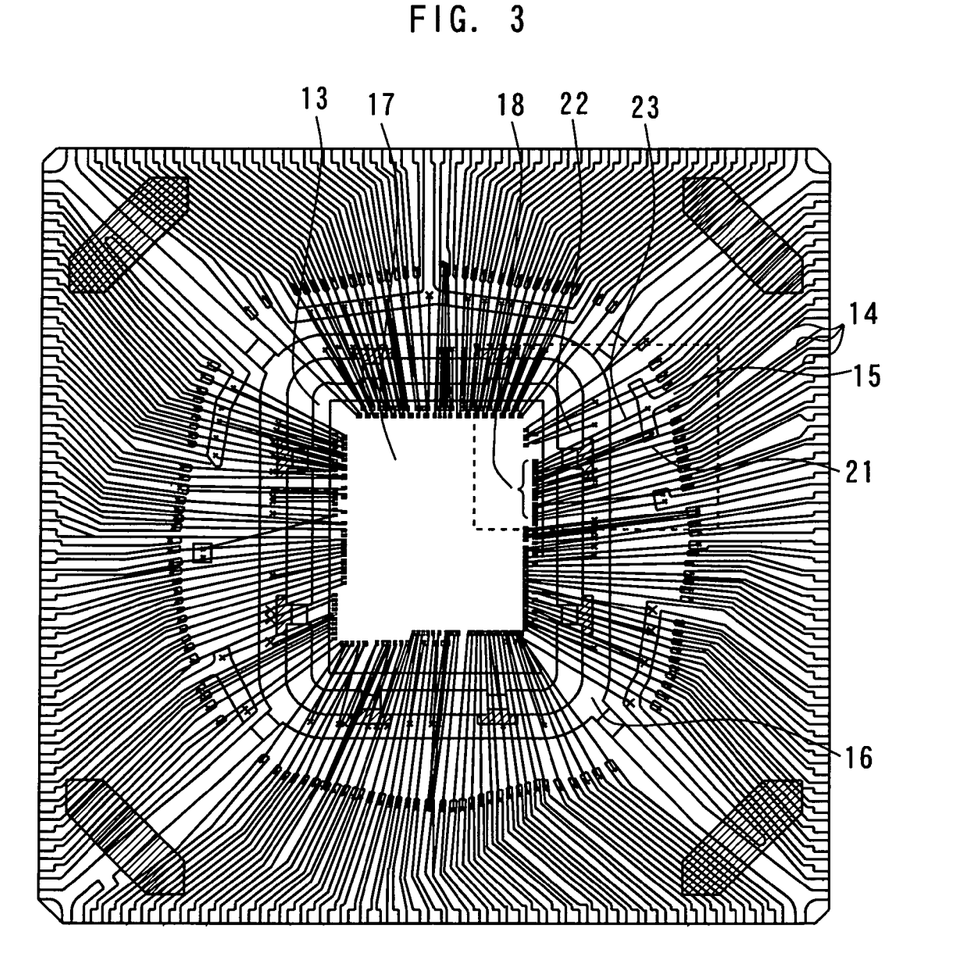
FIG. 3 is a plan view showing internal portions of the package body of the semiconductor device according to the first embodiment of the present invention.
Figure 4:
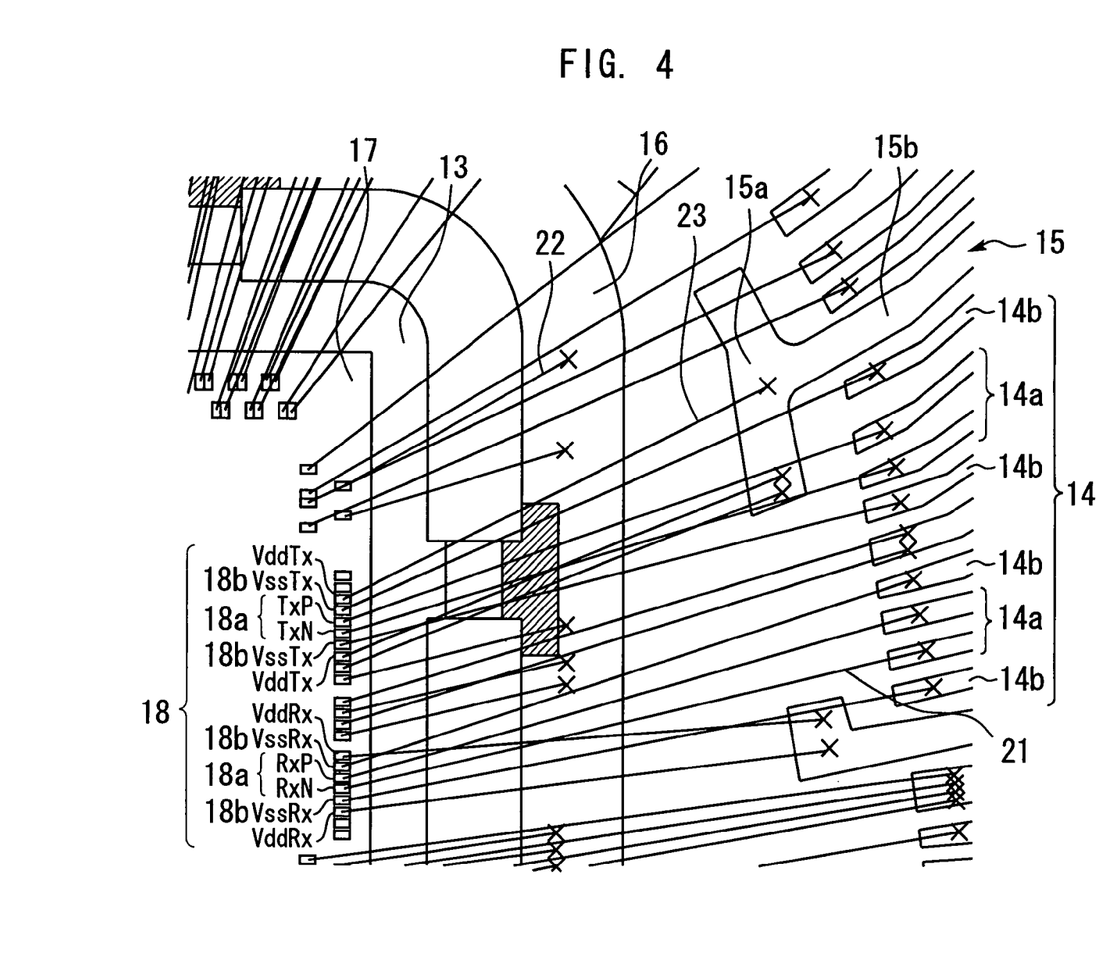
FIG. 4 is an enlarged plan view of an essential portion of FIG. 3.

FIG. 3 is a plan view showing internal portions of the package body of the semiconductor device according to the first embodiment of the present invention. FIG. 4 is an enlarged plan view of an essential portion of FIG. 3. A plurality of inner leads 14 and a T-shaped inner lead 15 are provided around a die pad 13 and are respectively connected to associated outer leads 12. The plurality of inner leads 14 include pairs of inner leads 14a for differential signals disposed adjacent to each other and inner leads 14b for fixed potentials disposed adjacent to the inner leads 14a for differential signals. A grounded GND lead 16 is provided between the die pad 13 and the plurality of inner leads 14.

A plurality of pads 18 are provided on a semiconductor chip 17. The plurality of pads 18 include pairs of pads 18a for differential signals disposed adjacent to each other and pads 18b for fixed potentials disposed adjacent to the pads 18a for differential signals. The pads 18 on the semiconductor chip 17 and the plurality of inner leads 14 are connected to each other by a plurality of wires 21 (first wires). Connections are made by means of GND wires 22 between the pads 18 on the semiconductor chip 17 and the GND lead 16. The GND wires 22 are disposed between the plurality of wires 21. Connections are made by means of wires 23 (second wires) between the pads 18 on the semiconductor chip 17 and the T-shaped inner lead 15.

In the present embodiment, the thickness of the inner leads 14 around the GND wires 22 is increased so that the distance between the ends of each adjacent pair of the inner leads 14 is 0.2 mm or less, thereby preventing the surface of the inner leads from being scratched by being rubbed even in a case where lead frames are stored in a state of superposed one on another.

The T-shaped inner lead 15 has first and second lead portions 15a and 15b. The first lead portion 15a is provided in a region between the die pad 13 and the plurality of inner leads 14 and extends along the direction of arrangement of the plurality of inner leads 14. The second lead portion 15b is provided between adjacent two of the plurality of the inner leads 14 and is connected to the first lead portion 15a. A plurality of wires 23 are connected to the T-shaped inner lead 15 to be connected to the outer lead 12 through only one second lead portion 15a.

The wires 23 are stitch-bonded to the first lead portion 15a of the T-shaped inner lead 15. For example, when one of the wires 23 stitch-bonded to the right half of the first lead portion 15a is cut by being pulled, the right half of the first lead portion 15a is also pulled upward. At this time, the left half of the first lead portion 15a can act as a support in contact with the base below to prevent the T-shaped inner lead 15 from being lifted up.

Figure 5:
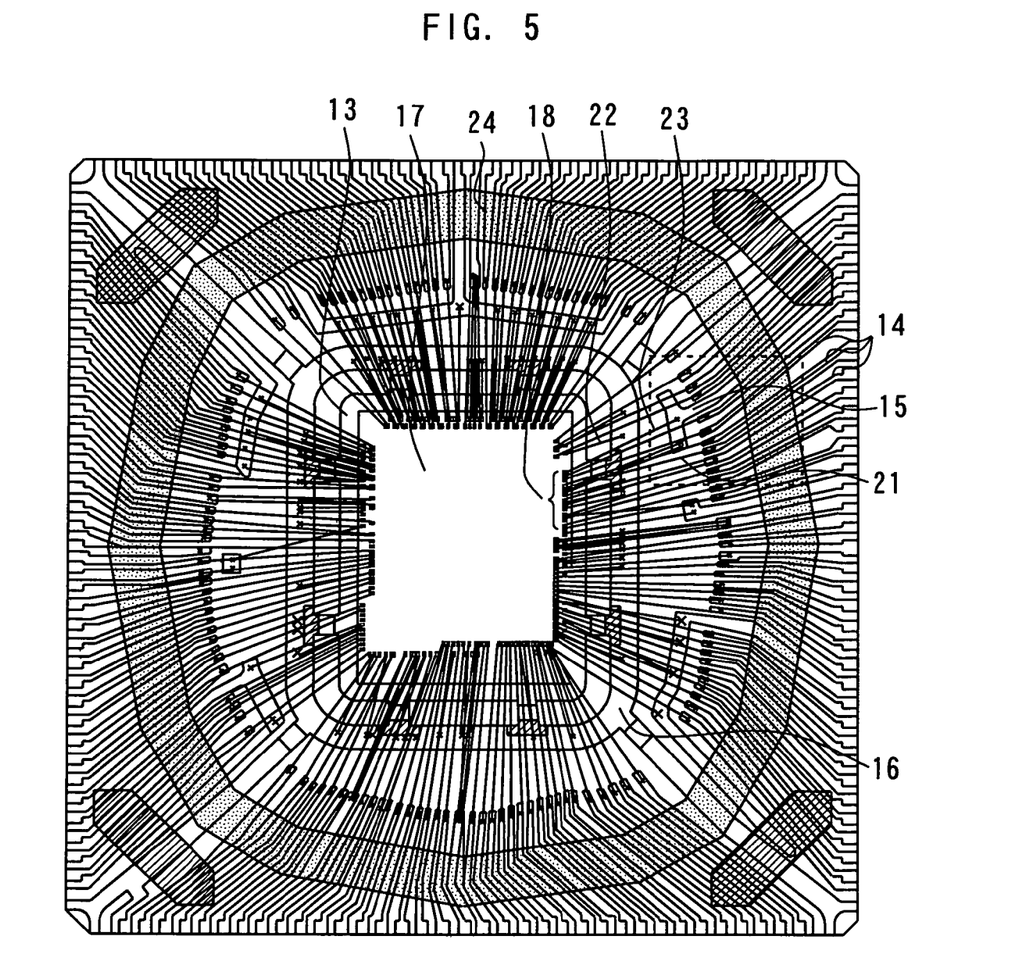
FIG. 5 is a plan view showing wire bonding in the process of manufacturing the semiconductor device according to the first embodiment of the present invention.
Figure 6:
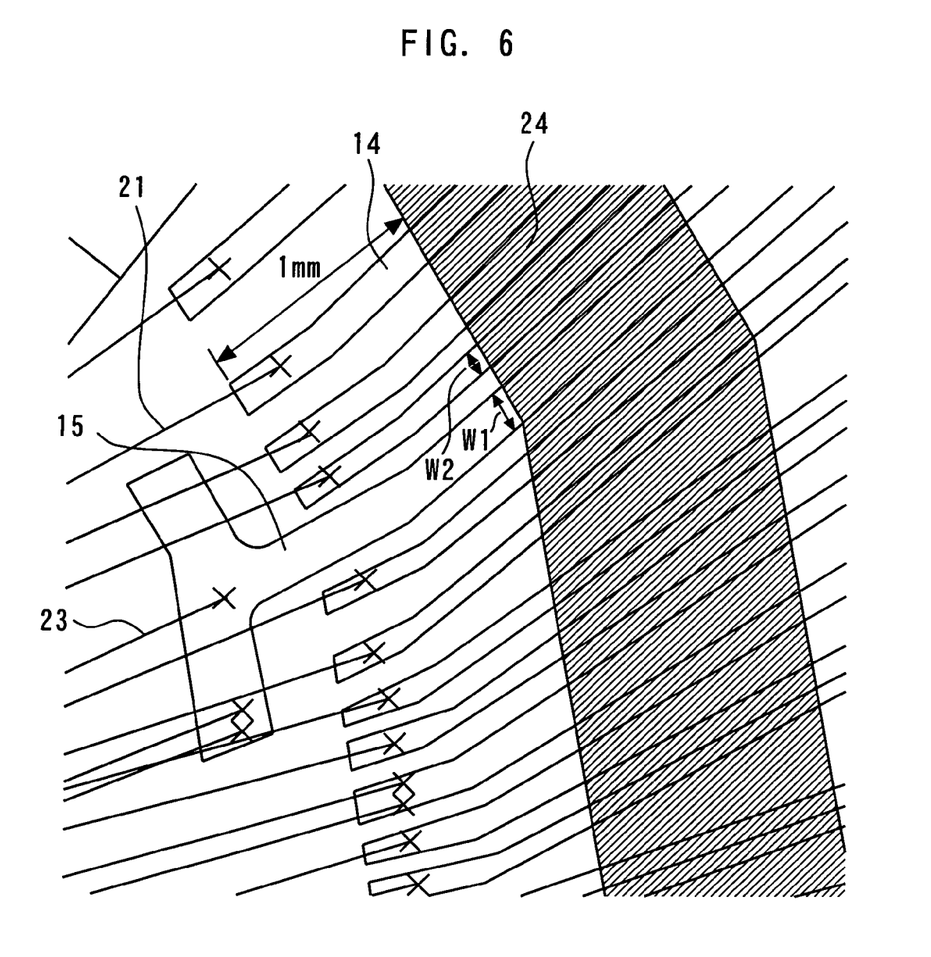
FIG. 6 is an enlarged plan view of an essential portion of FIG. 5.

FIG. 5 is a plan view showing wire bonding in the process of manufacturing the semiconductor device according to the first embodiment of the present invention. FIG. 6 is an enlarged plan view of an essential portion of FIG. 5. As illustrated, wire bonding is performed while retaining the inner leads 14 with a lead retainer 24 at a distance of 1 mm from the ends of the inner leads 14.

The T-shaped inner lead 15 is longer than the other inner leads 14, and the wires 23 are stitch-bonded to the portion extending to a region between the die pad 13 and a plurality of the inner leads 14. That is, the bonding portion is remote from the portion retained with the lead retainer 24. Then the width W1 of the portion of the T-shaped inner lead 15 retained with the lead retainer 24 at the time of wire bonding is set 1.5 times or larger than the width W2 of the thinnest inner lead 14 in the portions retained with the lead retainer 24 at the time of wire bonding, thereby preventing the T-shaped inner lead 15 from being lifted up.

Figure 7:
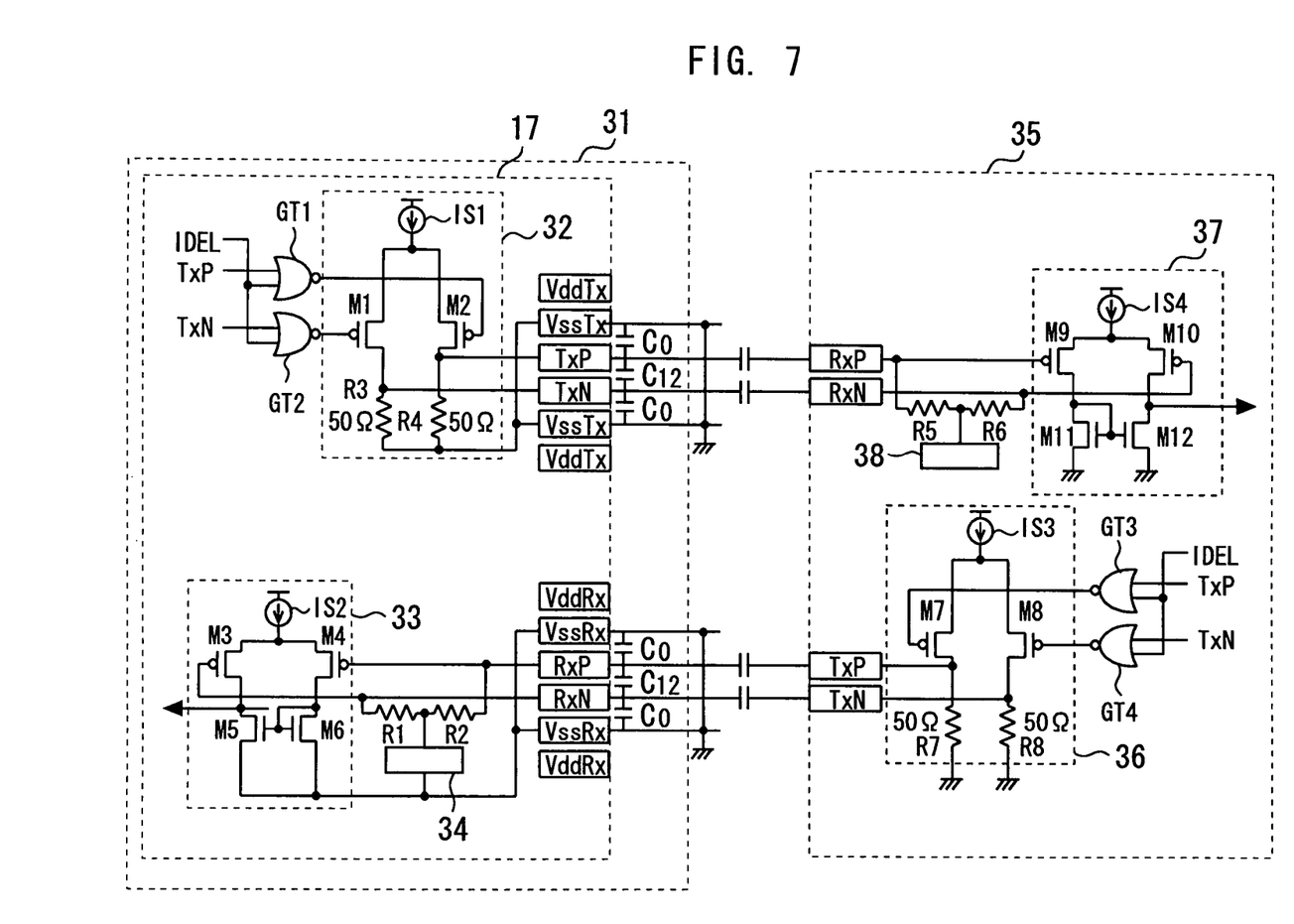
FIG. 7 is a diagram showing a state in which a semiconductor device according to the first embodiment of the present invention and a host-side device are connected to each other.

FIG. 7 is a diagram showing a state in which a semiconductor device according to the first embodiment of the present invention and a host-side device are connected to each other.

A semiconductor device 31 according to the first embodiment of the present invention has a driver circuit 32 and a receiver circuit 33 for high-speed differential signals, NOR circuits GT1 and GT2, resistors R1 and R2, a common-mode voltage generation circuit 34, high-speed differential signal output pins TxP and TxN, high-speed differential signal input pins RxP and RxN, GND potential pins VssTX and VssRX and power supply potential pins VddTx and VddRx.

The driver circuit 32 includes P-channel MOS transistors M1 and M2, resistors R3 and R4, and a current source IS1. The receiver circuit 33 includes P-channel MOS transistors M3 and M4, N-channel MOS transistors M5 and M6, and a current source IS2.

The common-mode voltage generation circuit 34 applies to a connection point between the resistors R1 and R2 a potential required for the receiver circuit 33 to normally receive a differential signal input through the input pins RxP and RxN.

A signal IDLE is an output control signal for the semiconductor device 31. That is, when the signal IDLE is high level, the P-channel MOS transistors M1 and M2 are on and no differential signal is output from the output pins TxP and TxN.

On the other hand, the host-side device 35 includes a driver circuit 36 and a receiver circuit 37 for high-speed differential signals, NOR circuits GT3 and GT4, resistors R5 and R6, a common-mode voltage generation circuit 38, high-speed differential signal output pins TxP and TxN, and high-speed differential signal input pins RxP and RxN. The driver circuit 36 includes P-channel MOS transistors M7 and M8, resistors R7 and R8, and a current source IS3. The receiver circuit 37 includes P-channel MOS transistors M9 and M10, N-channel MOS transistors M11 and M12, and a current source IS4.

A differential signal transmitted from the driver circuit 32 of the semiconductor device 31 is received by the receiver circuit 37 of the host-side device 35 via the output pins TxP and TxN of the semiconductor device 31 and the input pins RxP and RxN of the host-side device 35. A differential signal transmitted from the driver circuit 36 of the host-side device 35 is received by the receiver circuit 33 of the semiconductor device 31 via the output pins TxP and TxN of the host-side device 35 and the input pins RxP and RxN of the semiconductor device 31.

Figure 8:
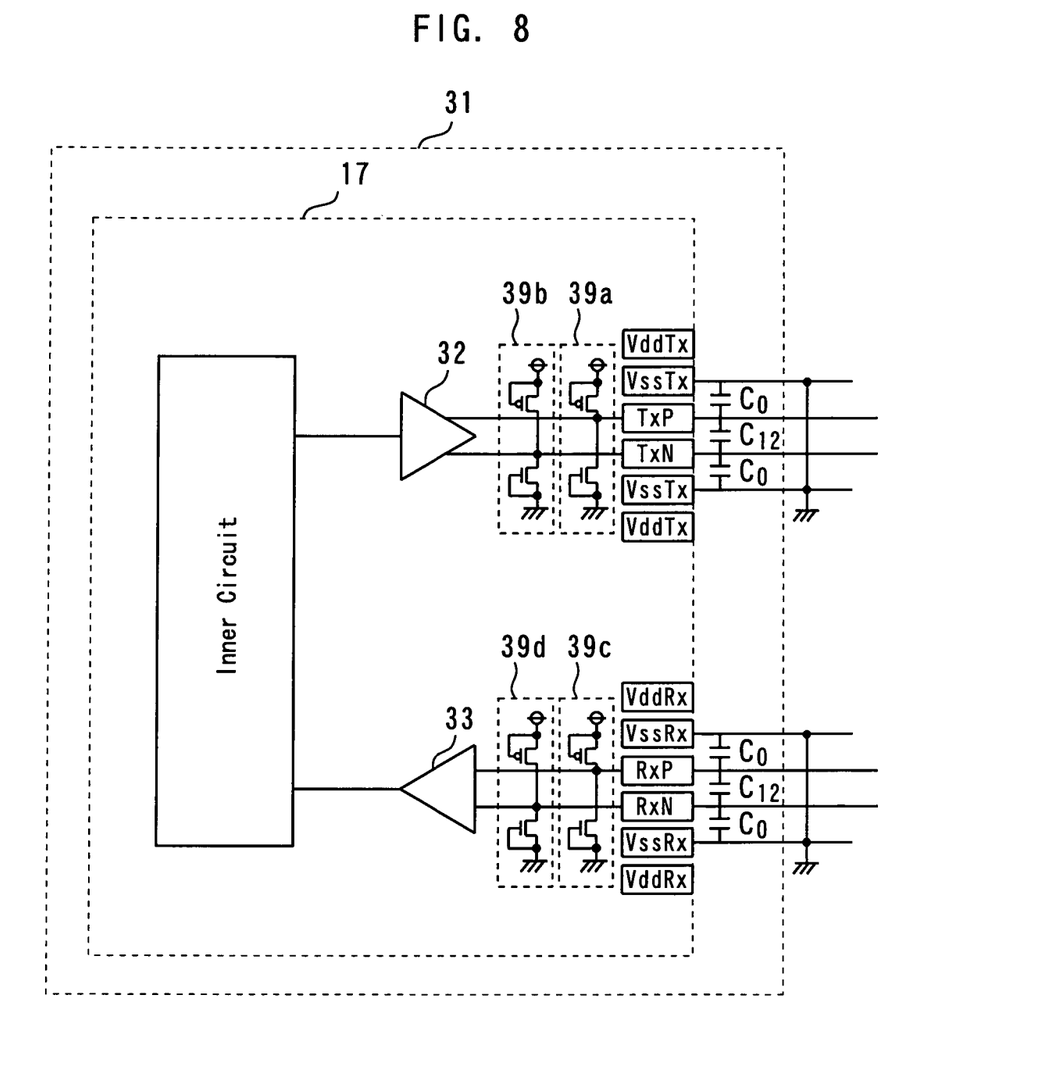
FIG. 8 shows electrostatic discharge (ESD) protective elements are incorporated in the semiconductor device according to a first embodiment of the present invention.

As shown in FIG. 8, electrostatic discharge (ESD) protective elements 39a to 39d for protecting the semiconductor chip 17 from electrostatic discharge are incorporated in the semiconductor device 31.

The ESD protective elements 39a is constituted by a P-channel MOS transistor having its source and gate connected to the power supply and its drain connected to a connection point between the driver circuit 32 and the output pin TxP, and an N-channel MOS transistor having its source and gate grounded and its drain connected to the connection point between the driver circuit 32 and the output pin TxP. Each MOS transistor functions virtually as a clamp diode, thereby enabling release of a surge current to the power supply or ground when the surge current is input through the output pin TxP. The other ESD protective elements 39b to 39d also have the same configuration and function.

The configuration of the ESD protective elements 39a to 39d is not limited to this. However, a semiconductor element having a reverse junction at the time of normal signal input is ordinarily used, so that a capacitance is produced at the reverse junction.

A large parasitic capacitance is attached in the vicinity of each pad 18 of the semiconductor chip 17. Parasitic capacitances are attached at various portions. However, a great part of them is parasitic capacitance between the semiconductor regions of the ESD protective elements 39a to 39d and the semiconductor substrate and parasitic capacitance between the pads 18 and other wiring conductors or the semiconductor substrate.

If a large parasitic capacitance is attached at an intermediate position in a transmission line, the characteristic impedance is reduced at the intermediate position. If a characteristic impedance mismatch is increased thereby, a loss due to signal reflection is increased and the signal transmission characteristics deteriorate.

However, it is difficult to reduce the parasitic capacitances at the pads 18, the ESD protective elements 39a to 39d, etc., to a negligible value. For example, securing the necessary capacity of the ESD protective elements 39a to 39d entails an increase in size of the elements, accompanied by an increase in parasitic capacitance. Also, if the area of the pads 18 necessary for wire bonding or bump forming is secured, the parasitic capacitance increases with increase in conductor area.

To prevent a reduction in characteristic impedances in the vicinity of each pad 18, the effective parasitic capacitance in another transmission line in the vicinity of the pad 18 may be reduced. In the present embodiment, the parasitic capacitance from each pad 18 to a terminal resistance of the driver circuit is 1 to 2 pF.

A transmission line acts as a distributed constant circuit in a radio-frequency region. It is, therefore, effective to reduce a parasitic capacitance in the vicinity of each pad 18 and the associated IO cell as largely as possible in canceling out the effect of the capacitance parasitic on the pad 18 and the IO cell. For example, in a transmission line of a data transmission rate exceeding 1 Gbps, it is effective to install a measure in a region within a distance of 2 cm at the maximum, preferably 1 cm from the pad 18.

In a package portion intermediating between the semiconductor chip 17 and the outside of the semiconductor device, it is easy to secure the desired amount of characteristic impedance adjustment through size control because of the existence of the package portion in the vicinity of the pads 18 and the large scale of the package portion. Attention is therefore focused on reduction in effective parasitic capacitance in the package portion.

For example, in the capacitance parasitic on the output pin TxP in the package portion, a parasitic capacitance $C_{12}$ between the output pin TxP and the output pin TxN through which a differential signal is output and a parasitic capacitance $C_0$ between the output pin TxP and the adjacent GND potential pin VssTx are dominant. From the viewpoint of preventing a reduction in characteristic impedance, it is preferable to reduce all these parasitic capacitances. However, increasing the distance between the pins to reduce the parasitic capacitances leads to an increase in sizes of the semiconductor device and, therefore, is not preferable.

The characteristic impedance of a line is the ratio of an electric field and a magnetic field in the line when an electric flux connecting charges appearing opposite to each other on the surfaces of two conductors moves along the line. That is, the characteristic impedance of a line is the ratio of an electric field and a magnetic field forming an electromagnetic wave advancing in the space between the conductors forming the line. Accordingly, the characteristic impedance $Z_0$ of a line is obtained by $Z_0=(L/C)^{0.5}$ if a loss is ignored, where C is the capacitance of the line and L is the inductance of the line.

The electric field generated between the signal pin TxP and the signal pin TxN is, ideally, twice the electric field generated between the signal pin TxP and the GND potential pin VssTx. Accordingly, the amount of reduction in electric field intensity when the distance between the signal pin TxP and the signal pin TxN is increased is twice that when the distance between the signal pin TxP and the GND potential pin VssTx is increased to the same extent.

If the signal pin TxP and the signal pin TxN generating a magnetic field canceling out that from the signal pin TxP is set so that the distance therebetween is increased, the strength of the magnetic field generated by the signal pin TxP is largely increased. Accordingly, the amount of increase in inductance in a case where the distance between the signal pin TxN and the signal pin TxP is increased is larger than that in a case where the distance between the GND potential pin VssTx and the signal pin TxP is increased to the same extent.

Thus, the virtual contribution of increasing the distance between the differential signal pins to the characteristic impedance is larger than that of increasing the distance from the fixed potential signal pin to the same extent. Consequently, it is effective to increase the distance between the differential signal pins at achieving a virtual reduction in capacitance and increase in inductance by allocating distances between the pins in a restricted size.

In the present embodiment, the distance between the two inner leads 14a for a differential signal is set larger than the minimum distance between the plurality of inner leads 14. In this way, a characteristic impedance mismatch can be reduced to prevent deterioration in signal transmission characteristics. Since not all the distances between the inner leads are increased, the increase in size of the semiconductor device can be limited.

Preferably, if possible, the distance between the differential signal inner lead 14a and the fixed potential inner lead 14b is set larger than the minimum distance between the plurality of inner leads 14. However, if a strict restriction is imposed on the external shape of the package, it is preferable to increase the distance between the two differential signal inner leads 14a relative to the distance between the differential signal inner lead 14a and the fixed potential inner lead 14b.

Second Embodiment

Figure 9:
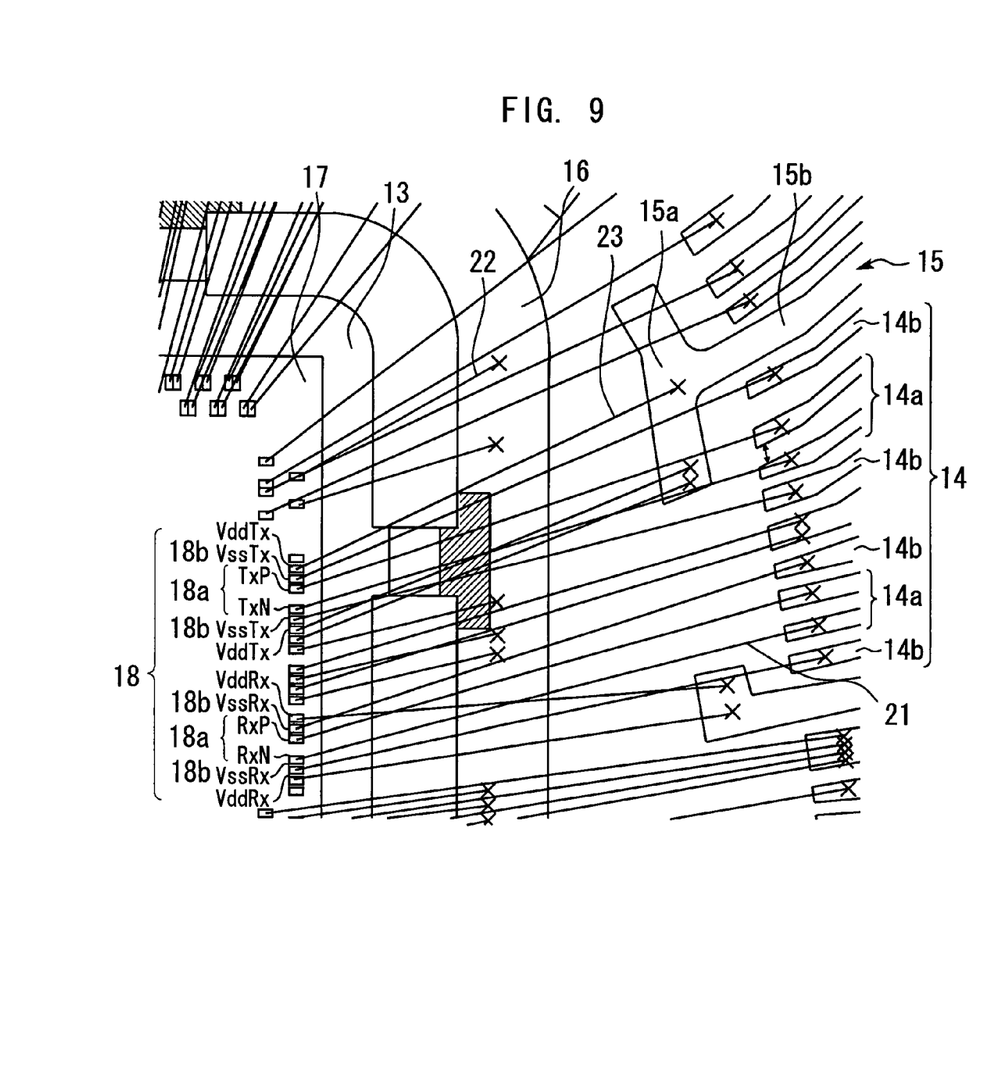
FIG. 9 is an enlarged plan view of an essential portion of a semiconductor device according to a second embodiment of the present invention.

FIG. 9 is an enlarged plan view of an essential portion of a semiconductor device according to a second embodiment of the present invention. While the distance between two differential signal inner leads 14a is increased in the first embodiment, the distance between two differential signal pads 18a is increased relative to the minimum distance between the plurality of pads 18 in the second embodiment.

In this way, the ball bonding positions can be set away from each other and the distance between the wires extending from the ball bonding positions can be increased, thereby reducing a characteristic impedance mismatch and enabling prevention of deterioration in signal transfer characteristics. Since not all the distances between the pads are increased, the increase in size of the semiconductor device can be limited. Since the transmission line acts as a distributed constant circuit, it is preferable to install measures as close to the pads 18 as possible according to the increase in signal frequency. The second embodiment is more effective in this respect than the first embodiment because measures can be installed more close to the pads 18.

Preferably, if possible, the distance between the differential signal pad 18a and the fixed potential pad 18b is set larger than the minimum distance between the plurality of pads 18. However, if a strict restriction is imposed on the external shape of the semiconductor chip 17, it is preferable to increase the distance between the two differential signal pads 18a relative to the distance between the differential signal pad 18a and the fixed potential pad 18b.

Third Embodiment

Figure 10:
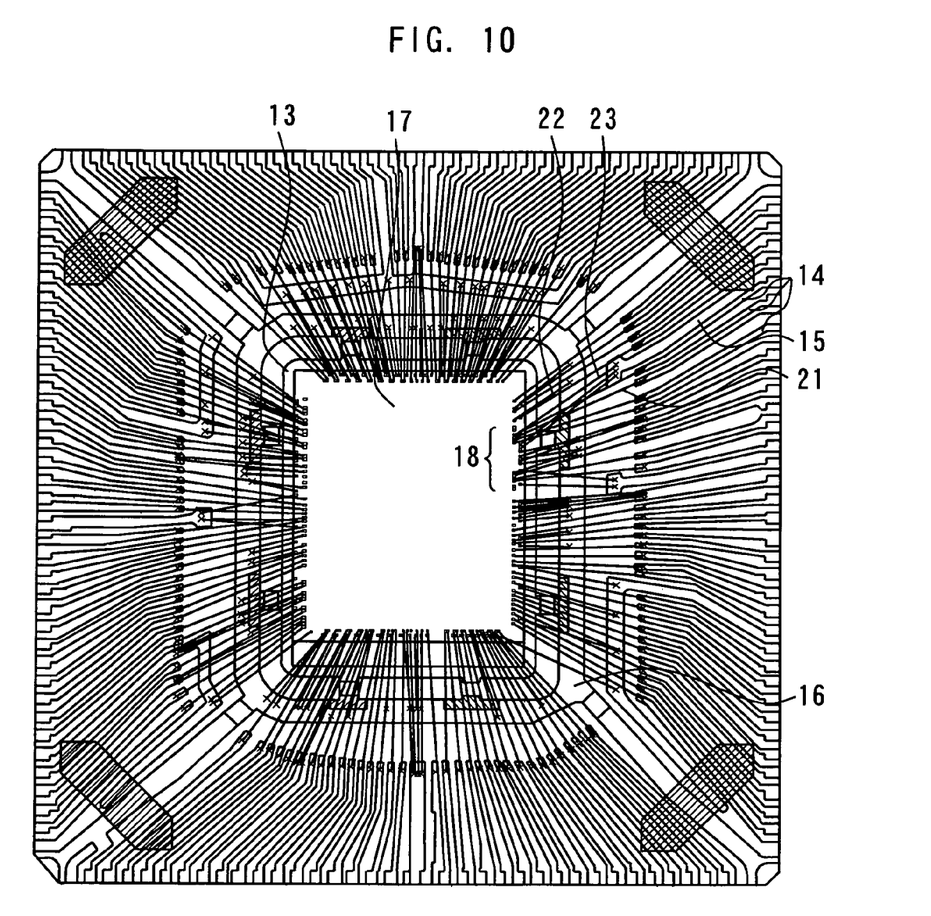
FIG. 10 is a plan view of a semiconductor device according to a third embodiment of the present invention, showing internal portions of a package body.
Figure 11:
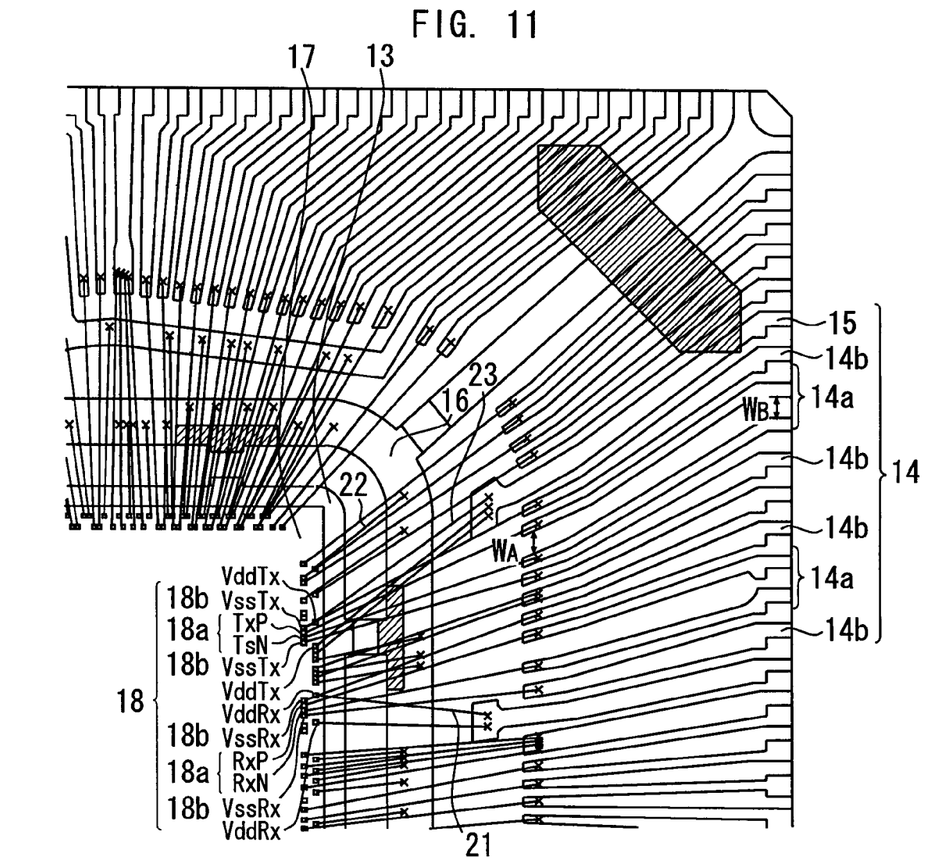
FIG. 11 is an enlarged plan view of an essential portion of FIG. 10.

FIG. 10 is a plan view of a semiconductor device according to a third embodiment of the present invention, showing internal portions of a package body. FIG. 11 is an enlarged plan view of an essential portion of FIG. 10. In the third embodiment, the distance WA between two differential signal inner leads 14a is set larger than the distance WB between portions of the differential signal inner leads 14a formed continuously with outer leads. For example, the distance WA is set to 250 μm, while the distance WB is set to 220 μm. In this way, a characteristic impedance mismatch can be reduced to prevent deterioration in signal transmission characteristics. Since not all the distances between the inner leads are increased, the increase in size of the semiconductor device can be limited.

It is preferable to avoid forming of a portion of a larger parasitic capacitance through the entire length of the differential signal inner leads 14a. For example, in the differential signal inner leads 14a, it is preferred that the distance between the portions of two differential signal inner leads 14a through the length larger than half the entire length be larger than the distance WB of the portions of the differential signal inner leads 14a formed continuously with the outer leads, and that the minimum distance between the two differential signal inner leads 14a is equal to or larger than the distance WB.

In some case of securing a sufficient lead distance between the differential signal inner leads 14a through the entire length, it is difficult to form a projection for preventing the lead from coming off in a region between each pair of differential signal inner leads 14a. In such a case, a configuration in which the inner lead is largely bent at an intermediate position may be adopted to avoid the problem that the lead comes off from the encapsulation resin.

Also, a lead-coming-off preventing projection may be provided on the surface opposite from the region between the differential signal leads. Also in this way, lead-coming-off prevention can be achieved while maintaining the minimum distance between the differential signal leads.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-055247, filed on Mar. 6, 2007 including specification, claims, drawings and summary, on which the Convention priority of the present application is based, are incorporated herein by reference in its entirety.

What is claimed is:

1. A semiconductor device comprising:
   a die pad;
   a semiconductor chip formed on the die pad, said semiconductor chip having a plurality of pads and a differential amplifier circuit formed on a main surface thereof, said plurality of pads having a first signal pad and a second signal pad each electrically connected to said differential amplifier circuit, and having a first fixed potential pad and a second fixed potential pad;
   a plurality of inner leads being disposed to surround said semiconductor chip,
   said plurality of inner leads having a first signal inner lead, a second signal inner lead disposed adjacent to said first signal inner lead to form a pair of differential signal leads, a first fixed potential inner lead disposed along said first signal inner lead at one side of said pair of differential signal leads, and a second fixed potential inner lead disposed along said second signal inner lead at the other side of said pair of differential signal leads, such that said pair of differential signal leads is disposed between said first and second fixed potential inner leads in a plan view provided around said die pad;
   a plurality of wires connecting together said plurality of inner leads and said plurality of pads, respectively, such that said first and second signal inner leads are connected with said first and second signal pads, respectively, and said first and second fixed potential inner leads are connected with said first and second fixed potential pads, respectively; and
   a resin member sealing said semiconductor chip, said die pad, said plurality of inner leads, and said plurality of wires,
   wherein said first signal inner lead and said second signal inner lead are disposed apart from each other by a first distance, said first signal inner lead and said first fixed potential signal inner lead are disposed apart from each other by a second distance, and said second signal inner lead and said second fixed potential inner lead are disposed apart from each other by a third distance, and
   said first distance is greater than each of said second distance and said third distance.

2. The semiconductor device according to claim 1, wherein each of said plurality of inner leads has a first end portion connected with a respective wire of said plurality of wires and a second end portion connected with a respective outer lead of a plurality of outer leads exposed from said resin member, wherein each of said first distance, said second distance and said third distance correspond to a distance defined by inner lead portions between said first and second end portions.

* * * * *